US010651108B2

(12) United States Patent
Tang et al.

(10) Patent No.: US 10,651,108 B2
(45) Date of Patent: May 12, 2020

(54) FOAM COMPOSITE

(71) Applicant: Intel Corporation, Santa Clara, CA (US)

(72) Inventors: Zhizhong Tang, Chandler, AZ (US); Syadwad Jain, Chandler, AZ (US); Wei Hu, Chandler, AZ (US); Michael A. Schroeder, Chandler, AZ (US); Rajen S. Sidhu, Portland, OR (US); Carl L. Deppisch, Chandler, AZ (US); Patrick Nardi, Scottsdale, AZ (US); Kelly P. Lofgreen, Phoenix, AZ (US); Manish Dubey, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 15/197,440

(22) Filed: Jun. 29, 2016

(65) Prior Publication Data

US 2018/0005917 A1   Jan. 4, 2018

(51) Int. Cl.
*H05K 5/00* (2006.01)
*H01L 23/373* (2006.01)
*H01L 23/498* (2006.01)
*H01L 23/00* (2006.01)
*H01L 23/42* (2006.01)
(Continued)

(52) U.S. Cl.
CPC ...... *H01L 23/3736* (2013.01); *H01L 23/3733* (2013.01); *H01L 23/3737* (2013.01); *H01L 23/42* (2013.01); *H01L 23/49811* (2013.01); *H01L 24/00* (2013.01); *F28D 2021/0029* (2013.01); *F28F 13/003* (2013.01); *F28F 21/02* (2013.01); *F28F 21/04* (2013.01); *F28F 21/08* (2013.01); *F28F 2013/001* (2013.01);
(Continued)

(58) Field of Classification Search
CPC ........................................................ H05K 7/00
See application file for complete search history.

(56) References Cited

U.S. PATENT DOCUMENTS

| 5,545,473 | A |   | 8/1996 | Ameen et al. |
| 6,037,658 | A | * | 3/2000 | Brodsky ............ H01L 23/42 |
|           |   |   |        | 257/706 |
| 2015/0213920 | A1 | * | 7/2015 | Lee .................... B32B 5/18 |
|           |   |   |        | 428/71 |

FOREIGN PATENT DOCUMENTS

| KR | 1020150007827 | 1/2015 |
| WO | 2016052599 | 4/2016 |
| WO | 2018004857 | 1/2018 |

OTHER PUBLICATIONS

"Battery Materials: Ni+Fe Foam, Ni+Cu Foam", Corun, [Online]. [Archived Mar. 18, 2016]. Retrieved from the Internet: <URL: http://www.corunusa.com/battery-materials>, 4 pgs.
(Continued)

*Primary Examiner* — Jerry Wu
(74) *Attorney, Agent, or Firm* — Schwegman Lundberg & Woessner, P.A.

(57) ABSTRACT

Devices and methods disclosed herein can include a conductive foam having pores disposed within the conductive foam. The conductive foam can be compressible between an uncompressed thickness and a compressed thickness. The compressed thickness can be ninety-five percent or less of the uncompressed thickness. In one example, a filler can be disposed in the pores of the conductive foam. The filler can include a first thermal conductivity. The first thermal conductivity can be greater than a thermal conductivity of air.

7 Claims, 5 Drawing Sheets

(51) Int. Cl.
  *F28F 13/00*   (2006.01)
  *F28F 21/04*   (2006.01)
  *F28F 21/02*   (2006.01)
  *F28F 21/08*   (2006.01)
  *F28D 21/00*   (2006.01)

(52) U.S. Cl.
  CPC .............. *H01L 2224/73204* (2013.01); *H01L 2224/73253* (2013.01)

(56) References Cited

OTHER PUBLICATIONS

"Duocel Copper Foam", ERG: Materials and Aerospace Corporation, [Online]. Retrieved from the Internet: <URL: http://ergaerospace.com/images/ERG%20Data%20Sheets%202.pdf>, (Accessed: Oct. 7, 2016), 1 pg.

"Foam", Wikipedia, [Online]. [Archived Mar. 31, 2016]. Retrieved from the Internet: <URL: https://en.wikipedia.org/wiki/Foam>, (Retrivied: Mar. 31, 2016), 9 pgs.

"International Application Serial No. PCT/US2017/033090, International Search Report dated Aug. 23, 2017", 3 pgs.

"International Application Serial No. PCT/US2017/033090, Written Opinion dated Aug. 23, 2017", 10 pgs.

* cited by examiner

FOAM COMPOSITE

TECHNICAL FIELD

This document pertains generally, but not by way of limitation, to a composite foam, such as composite interface foam or conductive foam.

BACKGROUND

Existing thermal interface materials, such as polymeric and elastomeric thermal interface materials can be used to transfer heat from electronic components. For example, electric components, such as memory, processors, radio, or the like can operate more effectively when heat generated by the electric component is transferred to a heat sink by way of the thermal interface material. The thermal interface material can be in contact with the electric component and the heatsink in order to transfer heat from the electric component to the heat sink. Some existing examples of these materials can have a thermal conductivity of about 4 W/m·k. Thermal interface materials can be compressible in some examples and in other examples, for instance solder, the thermal interface materials can be substantially incompressible. Solder can include higher thermal conductivity than polymeric and elastomeric thermal interface materials, making solder more suitable for applications where a greater amount of heat transfer is advantageous. In some examples, interface materials can be electrically conductive for making an electrical connection between an electric component (e.g., a semiconductor, circuit board, electronic package) and another device for transferring power or to provide grounding.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to devices and techniques for a conductive foam, such as a thermally or electrically conductive composite foam. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The subject matter disclosed herein is directed to transferring thermal energy, storing thermal energy, or providing electrical contact between two or more components of a system. The present inventors recognize, among other things, that a challenge can include providing an interface having a thermal or electrical conductivity closer to that of a solid conductor and a compliance, or an elastic compressibility, that can accommodate differences in distance between various components of the system.

The present subject matter can provide a solution to these challenges, for instance, a foam (such as a thermally conductive foam or an electrically conductive foam) can include a continuous path of thermally or electrically conductive material from a first side to a second side. The foam can include a compressed thickness and an uncompressed thickness. The compressed thickness can be ninety-five percent or less of the uncompressed thickness. In one example, the thickness of the foam can be elastically recoverable between the compressed thickness and the uncompressed thickness. Accordingly, the thermally or electrically conductive foam can transfer thermal energy (heat) or electricity from the first side of the foam to the second side of the foam where there are variations in distance between a heat generating component and a heat absorbing component or between two contacts of an electrical circuit.

In one example, the foam can include a filler disposed in the pores of the foam to construct a foam composite. The filler can include a first thermal conductivity that is greater than the thermal conductivity of air. The foam, for instance, can include an electrically conductive foam, a thermally conductive foam, or another type of foam. Thermal or electrical energy can be transferred through the filler or the filler and the foam (depending on the composition of the foam) from the first side to the second side of the foam. In one example, the filler can include a thermally absorbent material. For instance, the filler can absorb an amount of thermal energy from an electrical component without transferring a substantial portion of the thermal energy to another component (such as a heat sink).

In another example, the foam (e.g., the thermally conductive foam, electrically conductive foam, or foam composite) can include an interface sheet (e.g., a thermal interface sheet or an electrical interface sheet) disposed along at least the first side or the second side of the foam. The thermal interface sheet can include a conductive material (thermally or electrically conductive), such as copper, aluminum, carbon, solder, or the like. The interface sheet can reduce the contact resistance between the foam and the heat generating component and the heat absorbing component or between two contacts of an electrical circuit. Unless stated otherwise, the term conductive as referred to in this disclosure can include thermal conductivity or electrical conductivity.

Figure 1:
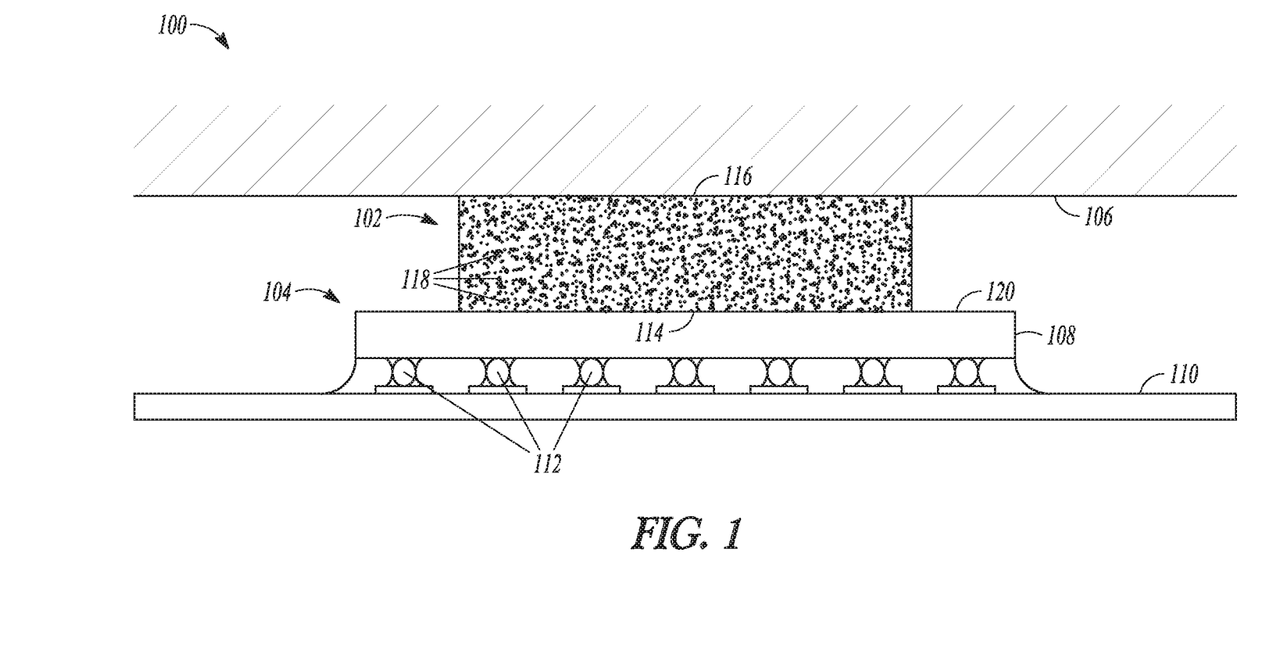
FIG. 1 illustrates an example of an electronic assembly including an electronic package and a conductive foam, according to an embodiment.

FIG. 1, shows an exemplary cross section of an electronic assembly 100 including a conductive foam 102, an electronic package 104, and a heat sink 106. The conductive foam 102 (e.g., a thermally conductive foam) can be located between the electronic package 104 and the heat sink 106. Accordingly, the conductive foam 102 can transfer heat between the electronic package 102 and another component of the electronic assembly 100, such as the heat sink 106, an electrical device, or other component. In one example, the conductive foam 102 can be compressed between the electronic package 104 and the heat sink 106. For instance, the conductive foam 102 can include a compressed thickness and an uncompressed thickness. The compressed thickness can include, but is not limited to, ninety-five percent, ninety-percent, eighty-percent, fifty-percent, or other percentage of the uncompressed thickness. The compression of the conductive foam 102 can increase a contact force between the conductive foam 102 and the electronic package 104, the heat sink 106, the electrical device, or other component. Accordingly, a contact resistance (e.g., a thermal or electrical contact resistance) between the conductive foam 102 and the heat sink 106, electrical device, or other component can be decreased correspondingly by compressing the conductive foam 102 and increasing the contact force.

The electronic package 104 can include an electronic component 108 coupled to a substrate 110. For instance, the electronic component 108 can be electrically coupled to one or more conductive layers of the substrate 108 by at least one contact 112. The substrate 110 can include a single sided, double sided, or multi-layer construction. For instance, the substrate 110 can have dielectric layers fabricated from materials including, but not limited to, FR-4, prepreg, ceramic, epoxy, other glass or fiber filled resin, or the like. The substrate 110 can provide mechanical support for the electronic package 104, circuit routing, thermal energy distribution, or electromagnetic shielding, among other things. For instance, the substrate 110 can include a core including, but not limited to, a ceramic core for providing mechanical support. In one example, the substrate 110 can include a Copper Clad Laminate (CCL). The CCL can include the conductive layer (e.g., metallic foil) that can be attached to (e.g., laminated on) or between one or more dielectric layers of the substrate 110. In one example, the conductive layer can be printed on to the substrate 110, for instance with an inkjet printer. In one example, the conductive layer can be electrodeposited (electroplated) onto the substrate 110. Once the conductive layer is coupled to the substrate 110, the conductive layer can then be etched to create electronic circuits.

The electronic component 108 can include, but is not limited to, a semiconductor, silicon die, integrated circuit, resistor, capacitor, light emitting diode, transceiver, or other component. In the example of FIG. 1, the electronic component 108 is a silicon die configured as a microprocessor. The electronic package 104 can produce a significant amount of heat during operation. In one example, the electronic package 104 can have operational characteristics. The operational characteristics can include a temperature range in which the electronic package 104 is designed operate, for instance, between −40° C. to 125° C. Stated another way, electronic package 104 can operate at an enhanced performance level or a prolonged duration within the temperature range of the operational characteristics. For instance, the operation of the electronic package 104 can be improved by dissipating a portion of the heat generated by the electronic package 104 to keep the temperature of the electronic package 104 within the temperature range of the operational characteristics. In one example, the electronic component 108 (of the electronic package 104) can include a dissipation surface 120 where a significant amount of heat generated by the electronic component 108 can be dissipated. The conductive foam 102 can interface with the dissipation surface 120 of the electrical component 108. In one example, the conductive foam 102 (e.g., the thermally conductive foam) can transfer the portion of heat generated by the electronic package 104 to the heat sink 106. Accordingly, the electronic package 104 can operate within an operational temperature range.

In one example, the electronic package 104 can include a plurality of electrical components 108. A distance from the heat sink 106 to one electrical component 108 can be less than or greater than a distance from the heat sink 104 to another electrical component 108. For instance, various electrical components 108 of the electronic package 104 can include different dimensions, such as different heights (e.g., thicknesses). In another example, various electrical components 108 of the electronic assembly 100 can be located on different electronic packages 104 or the shape of the heat sink 106 can result in different dimensions between the heat sink 106 and the various electrical components 108 of the electronic assembly 100. For example, the distance variation between the electrical components 108 and the heat sink 106 can be 5 µm, 10 µm, 15 µm, or other. Despite the differences in distance, the conductive foam 102 can transfer heat from more than one electrical component 108 simultaneously. For instance, the compressibility of the conductive foam 102 can accommodate the variation in distances from the heat sink 106 to the various electrical components 108. Accordingly, the conductive foam 102 can be in compression between the heat sink 106 and each of the electrical components 108.

The heat sink 106 can be configured to absorb or dissipate the thermal energy (heat) transferred from the electronic package 104 through the conductive foam 102. For instance, the heat sink 106 can include a thermal mass sufficient to absorb the heat transferred from the electronic package 104. In one example, the heat sink 106 can include one or more fins configured to dissipate the heat transferred from the electronic package 104 through the conductive foam 102 into a fluid. For instance, the fluid can be surrounding air or liquid coolant flowing across the heat sink 106. The liquid coolant can include, but is not limited to water, a water glycol mixture, other refrigerant, or the like. In one example, the heat sink 106 can be integrated with a heat exchanger. The heat sink 106 can be constructed from a variety of materials including, but not limited to, aluminum, steel, copper, zinc, brass, iron, or other material.

As previously stated, the conductive foam 102 can include a thermally conductive foam or an electrically conductive foam. The conductive foam 102 can include a continuous path of thermally or electrically conductive material from a first side 114 of the conductive foam 102 to a second side 116 of the conductive foam 102. The conductive foam 102 can include a plurality of pores 118 disposed within the foam material. In one example, the conductive foam 102 can be an open cell foam having 5, 10, 50, 100 pores per inch, or other. For instance, the pores can include a diameter between 1.0 mm and 5.0 mm. The thickness (uncompressed thickness) of the conductive foam 102 can include, but is not limited to, between 0.1 mm and 6.0 mm. In one example, the compressed thickness of the conductive foam 102 can include 2%, 5%, 10%, 30%, or 50% of the uncompressed thickness. Material properties of the conductive foam 102 can include a yield strain of 5% or greater providing a recoverability characteristic. Stated another way, the conductive foam 102 can be compressed to 95% of the uncompressed thickness and recover to the original uncompressed thickness when a compressive load is removed.

Where the conductive foam 102 is a thermally conductive foam, the conductive foam 102 can be constructed substantially of aluminum, copper, carbon, graphite, silicon carbide, aluminum oxide, ceramic, or the like. The conductive foam 102 can include a thermal conductivity between 10 W/m·K and 400 W/m·K. For instance, the foam can include a metallic foam (e.g., substantially metallic foam), such as copper foam. The substantially metallic foam can be constructed from a material that is a metal or a metal alloy (e.g., at least 50% pure metal). In the example of a copper foam, the conductive foam 102 can include a relative density between 3% and 15% of a solid copper material. In one example, the conductive foam 102 can include a bulk thermal conductivity of at least 10 W/m·K. The bulk thermal conductivity of the conductive foam 102 can be correlated the density of the conductive foam 102. For instance, a copper foam with a density of 9% can have a thermal conductivity of 10 W/m·K and a copper foam with a density of 15% can have a bulk thermal conductivity of 24 W/m·K. Accordingly, the conductive foam 102 can transfer heat from the electronic package 104, for instance, the conductive foam 102 can transfer enough heat from the electronic package 104 to keep the electronic package 104 within the operational temperature range.

In other examples, the conductive foam 102 can include an electrically conductive foam. The electrically conductive foam 102 can be coupled between the electronic package 104 and the electrical device (as previously discussed). The electrical device can include, but is not limited to, an electromagnetic shield, battery contact, circuit, switch, or the like. In one example, the conductive foam 102 can be constructed from any of the materials previously described with respect to the thermally conductive foam. The material of the electrically conductive foam depends upon requirements for electrical conductivity. In the example of a copper foam, a bulk electrical resistivity of the copper foam (e.g., and 8% density copper foam) can be $6.5 \times 10^{-7}$ ohm·m. In other examples, the electrical resistivity of the conductive foam 102 can include $1.7 \times 10^{-8}$ ohm·m, $16 \times 10^{-8}$ ohm·m, or any value in between. Similarly to thermal conductivity, the electrical conductivity of the conductive foam 102 can be correlated to the density of the conductive foam 102. For instance, a higher density conductive foam 102 can have a higher electrical conductivity (i.e., a lower electrical resistivity).

Figure 2:
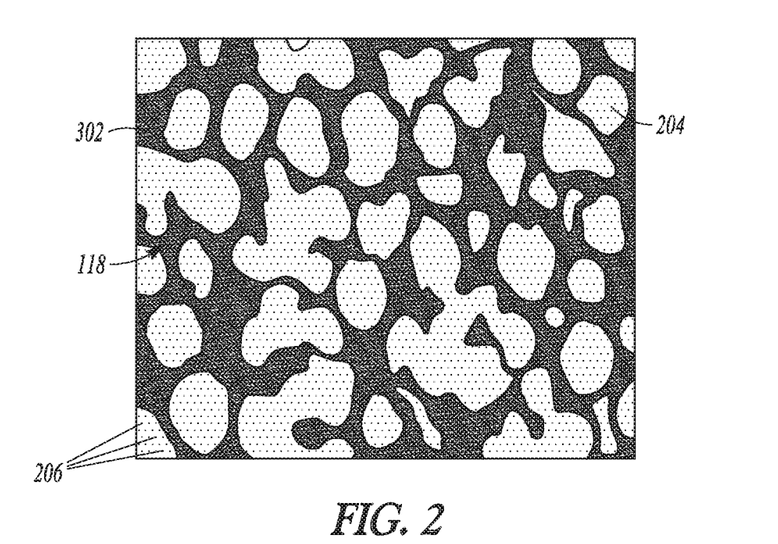
FIG. 2 is a cross section an exemplary foam composite including a conductive foam and a filler disposed within the pores of the conductive foam, according to an embodiment.

FIG. 2 illustrates a detailed cross section of a foam composite 200. The foam composite 200 can include a foam 202 and a filler 204. For instance, the foam 202 can include a plurality of pores 118 and the filler 402 can be located within the pores 118. The filler 204 can increase the thermal conductivity of the foam composite 200. In one example, the foam composite 200 can be included in the electronic assembly 100 shown in FIG. 1. Accordingly, the foam composite 200 can transfer heat or conduct electricity from the electronic package 104 to a heat sink 106 or an electrical device (as previously described herein). In the example of the foam composite 200, the foam 202 can include open cell or closed cell foam 202. For instance, the foam 202 can include any of the thermally or electrically conductive foams (e.g., conductive foam 102) previously described herein. In one example, the foam composite 200 can also include foam materials including, but not limited to polyurethane, polyvinyl chloride, or the like. In one example, the foam 202 can include lower values of thermal or electrical conductivity than conductive foam 102 because the filler 204 can provide a continuous path of conductive material within the pores of the foam 202. For instance, the thermal conductivity of the foam 202 can include 0.02-400 W/m*K. The electrical resistivity of the foam 202 can include $32 \times 10^{-4}$ ohm·m, $1.7 \times 10^{-8}$ ohm·m, or any value in between. The foam 202 can provide a mechanical structure for the filler 204. For instance, the foam 202 can provide a scaffolding for the filler 204. In one example, the foam 202 can provide mechanical resiliency between the compressed and uncompressed states of the foam 202. Stated another way, the foam 202 can recover from a compressed state to an uncompressed state.

The filler 204 can include, but is not limited to, water, quench oil, paraffin wax, other phase change material, or the like. The filler 204 can be a liquid, gel, or solid material at room temperature. In one example, the filler 204 can include a thermal conductivity or electrical conductivity that is greater than air. For instance, the filler 204 can increase the thermal or electrical conductivity of the foam composite 200. In one example, the filler 204 can include a thermal conductivity between 10 W/m·K and 400 W/m·K. The electrical resistivity of the filler 204 can include $1.7 \times 10^{-8}$ ohm·m, $16 \times 10^{-8}$ ohm·m, or any value in between. Accordingly, the filler 204 can provide a continuous path of conductive material (e.g., thermally conductive or electrically conductive) extended from a first side to a second side 116 of the foam composite 200 either independently or in combination with the conductive foam 102. In one example, the filler 204 can reduce the contact resistance between the foam composite 200 and the electronic package 104, heat sink 106, electrical device, or other component. For instance, the filler 204 can increase the surface area in contact between the foam composite 200 and the electronic package 104 (e.g., electronic component 108), heat sink 106, electrical device, or other component.

The size of the pores 118 can be configured to hold the filler 204 by a surface tension characteristic of the filler 204. Stated another way, the size of the pores 118 can correspond to the surface tension of the filler material and include a sufficiently small diameter to retain the filler 204 within the pores 118 of the foam 202. Accordingly, once the filler 204 is located within the pores 118 the surface tension characteristic of the filler can retain the filler 204 within the foam 202.

As previously described, the filler 204 can include a phase change material, such as paraffin wax. The phase change material can absorb heat during a transition between phases (e.g., solid to liquid). In further example, the phase change material can transition between solid and liquid and transition between liquid and gas phases. When the phase change material reaches a temperature in which the phase transition begins (transition onset temperature), the phase change material can absorb heat while substantially maintaining the transition onset temperature until the phase change is complete. Upon completion of the phase change, the phase change material can rise in temperature when heat is applied. Consequently, the filler 204 can absorb thermal energy from the electric assembly 100, such as thermal energy dissipated by the electronic package 104.

In the example of FIG. 2, the filler 204 can include particles 206 disposed within the filler 204. The thermal conductivity of the particles 206 can include 10 W/m·K, 2000 W/m·K, or any value in between. Accordingly, the particles 206 can increase the thermal or electrical conductivity of the filler 204 and correspondingly the foam composite 200. The particles 206 can include, but are not limited to, silicon carbonate, diamond, zinc oxide, or the like. The size of the particles 206 can include, but are not limited to, between 0.1 and 100 microns. In one example, the particles 206 can include a phase change material as previously described.

Figure 3:
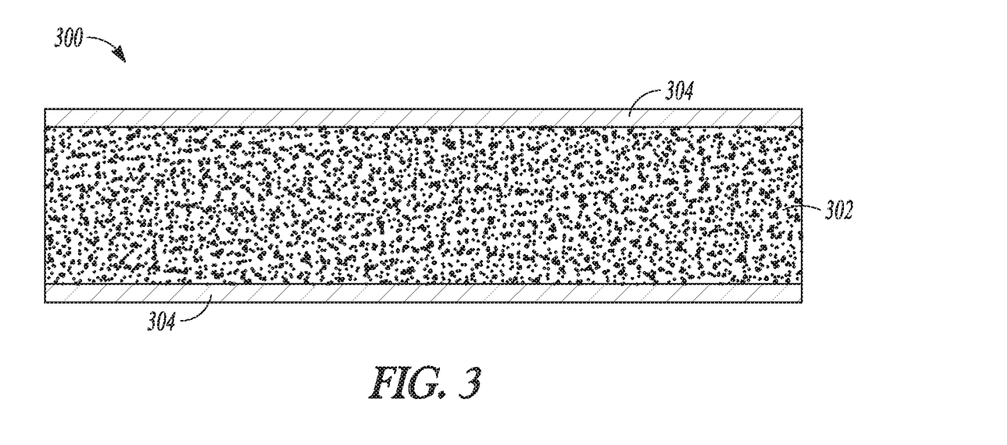
FIG. 3 illustrates an example of a foam composite including a first and a second interface sheet, according to an embodiment.

FIG. 3 depicts an exemplary foam composite 300 including a conductive foam 302 and at least one interface material 304. The interface material 304 can include, but is not limited to, a metallic foil (e.g., copper, gold, aluminum, tin, silver, or the like), thermal grease, thermal epoxy, conductive polymer, phase change material, solder, or other. In one example, the interface material 304 can be electrically or thermally conductive. The interface material 304 can be attached to the foam 302. For instance, the interface material 304 can be attached to the foam 302 with solder, thermally conductive adhesive, thermal grease, or the like. In other examples, the interface material 304 can be welded or braised to the foam 302. In the example of FIG. 3, the interface material 304 can include an interface sheet, constructed from a copper foil. The copper foil can be soldered to the foam 302 with a solder material including, but not limited to, indium, Pd—Sn, SnAgCu alloy, or the like. In one example, the interface material 304 can include a coating including, but not limited to, gold, silver, copper, tin, or the like. The coating can increase the solderability, corrosion resistance, thermal conductivity, or electrical conductivity of the interface sheet 304.

The foam 302 can include a thermally conductive foam or an electrically conductive foam, such as the conductive foam 102 as shown in FIG. 1 and previously described herein. For instance, the foam 302 can be metallic, such as a copper foam. In one example, the foam 302 can include the foam composite 200 having the foam 202 and the filler 204. As previously described, the filler 204 can include the particles 306 disposed within the filler 204.

In one example, the foam composite 300 can be included in the electronic assembly 100. For instance, the foam composite 300 can be located between the electronic package 104 and the heat sink 106. In one example, the foam composite 300 can be located between the electronic package 104 and the electrical device. The interface material 304 (e.g., the interface sheet) can decrease the contact resistance between the foam 302 and the electronic package 104, heat sink 106, electrical device, or other component. For instance, the foam 302 can include uneven and intermittent contact along the first or second side as a result of the pores 118 along the first side 114 or second side 116 of the foam 302. The interface material 304 can provide an increased surface area of contact in comparison to the first side 114 and the second side 116 of the foam 302. Accordingly, the interface material 304 can decrease the contact resistance of the foam 302 and correspondingly decrease the contact resistance of the foam composite 300. The decreased contact resistance can increase the amount of thermal or electrical energy that can be transferred into or thought the foam composite 300.

In one example, the interface material 304 can be soldered to the electronic package 104, such as to the electronic component 108. For instance, the interface material 304 can be soldered to the dissipation surface 120 of the electronic component 108. The dissipation surface 120 and the interface material 304 can make imperfect contact as a result of variations in surface flatness between the interface material 304 and the dissipation surface 120 of the electronic component 108. Soldering the interface material 304 to the dissipation surface 120 can increase the amount of surface area in contact between the electronic component 108 and the interface material 304. Accordingly, the contact resistance between the electronic component 108 and the foam 302 can be reduced. In one example, a solder preform can be attached to the interface material 304 or the foam 302. Accordingly, the foam composite 300 can be placed on to the electronic component 108 (e.g., by a pick and place machine) and the foam composite 300 can be soldered to the electronic component 108, for instance, by passing the foam composite 300 and the electronic package 104 through a reflow oven.

Figure 4:
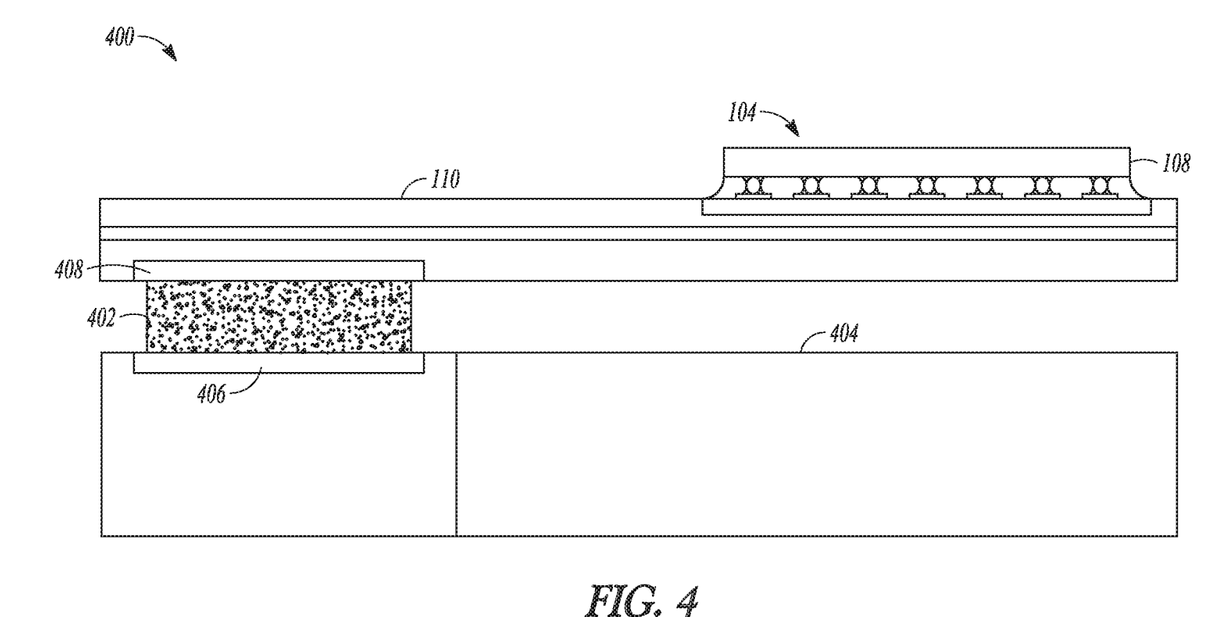
FIG. 4 is an exemplary illustration of a conductive foam located between a battery and an electronic package, according to an embodiment.

FIG. 4 is a schematic of an electronic assembly 400 including a foam 402 located between a battery 404 and the electronic package 104 (as previously described herein). The foam 402 can include the conductive foam 102, foam composite 200, foam composite 300, or any combination thereof. For instance, the foam 402 can be electrically conductive. In the example of FIG. 4, the electronic package 104 can include a substrate contact interface 408 and the battery 404 can include at least one battery cell and a battery contact interface 406.

The foam 402 can be located between the battery contact interface 406 and the substrate contact interface 408. In one example, the foam 402 can be compressed between the battery contact interface 406 and the substrate contact interface 408. For instance, the battery 404 can be located adjacent to the electronic package 104 at a distance that is less than an uncompressed thickness of the foam 402. The foam 402 can have a compressed thickness and an uncompressed thickness as previously described herein with regard to the examples of FIGS. 1-3. In the compressed state, a contact force can be applied to the battery contact interface 406 and the substrate contact interface 408 as a result of the compressed state of the foam 402. Accordingly, the contact resistance between the foam 402 and the battery contact interface 406, or the foam 402 and the substrate contact interface 408, can be reduced.

In the example of FIG. 4, the electronic package 104 can include an electronic component 108. The foam 402 can transmit electrical power from the battery 404 through the battery contact interface 406 and to the electronic package 104 and accordingly to the electronic component 108 through the substrate contact interface 408. The compliance (i.e., compressibility) of the foam 402 can reduce the possibility of a loss of electrical contact between the battery contact interface 406 and the substrate contact interface 408. For instance, variations in distance between the battery contact interface 406 and the substrate contact interface 408 can be accommodated by the compliance of the foam 402. Such variations in distance can result from dimensional variation in the battery 404, the electronic package 104, or the electronic assembly 400. In one example, the compliance of the foam 402 can prevent a loss of electrical contact between the battery contact interface 406 and the substrate contact interface 408 resulting from vibration, shock, impact, temperature change, or the like.

Figure 5:
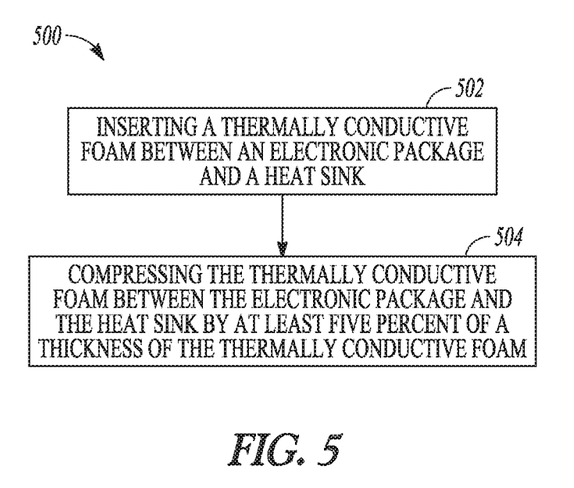
FIG. 5 is block diagram of an exemplary technique for making a composite foam, according to an embodiment.

FIG. 5 shows a diagram of an exemplary technique 500 for making an electronic assembly 100 as previously described herein. In describing the technique 500, reference is made to one or more components, features, functions, and steps previously described herein. Where convenient, reference is made to the components, features, steps and the like with reference numerals. Reference numerals provided are exemplary and are nonexclusive. For instance, features, components, functions, steps, and the like described in the technique 500 include, but are not limited to, the corresponding numbered elements provided herein. Other corresponding features described herein (both numbered and unnumbered) as well as their equivalents are also considered.

At 502, a foam (such as the conductive foam 102, foam composite 200, foam composite 300, or the like) can be inserted between the electronic package 104 and the heat sink 106. The first side 114 of the foam can be interfaced with the dissipation surface 120 of the electronic package 104 and the second side 116 of the foam can be interfaced with the heat sink 106. The foam can include pores 118 disposed within the foam. In one example, the foam can be thermally conductive foam or electrically conductive foam as previously described herein. In one example, the interface material 304 can be attached to at least one side of the foam as shown if FIG. 3 and described herein. For instance, the interface material 304 can be soldered to the foam or attached to the foam by an adhesive including, but not limited to, conductive adhesive, conductive epoxy, thermal or electrical grease, or the like. The interface material 304 can be constructed from a thermally or electrically conductive material, such as copper, gold, aluminum, tin, silver, thermal grease, thermal epoxy, conductive polymer, phase change material, solder, or other, as previously described.

In one example, the pores 118 (or substantial percentage of pores 118) can be filled with the filler 204. The filler 204 can include a variety of materials and a variety of properties as previously described herein. For instance, the filler 204 can include a thermal conductivity greater than that of air (i.e., 5 W/m·K). In one or more examples, the filler 204 can include a plurality of particles disposed within the filler. For instance, the particles 206 can include thermally or electrically conductive particles 206. The thermal or electrical conductivity of the particles 206 can exceed the electrical or thermal conductivity of the filler 204. In one example, the filler 204 can include a liquid, gel, or phase change material. The size of the pores 118 can be configured to retain the filler 204 within the pores by the surface tension characteristic of the filler 204. The pores 118 can be filled with the filler 204 by a variety of processes including, but not limited to, submerging the foam into the filler 204 and pressurizing the filler 204 into the pores 118.

At 504, the foam (e.g., conductive foam 102, foam composite 200, foam composite 300) can be compressed between the electronic package 104 and the heatsink 106 by at least five percent of the uncompressed thickness of the foam. In one example, the foam can be inserted between the electronic package 104 and the electrical device (e.g., battery 404). Accordingly, an electronic assembly 100 can be constructed including a conductive foam 102 or foam composite (e.g., foam composite 200 or 300) having a thermal conductivity of at least 10 W/m·K or an electrical conductivity of at least $6.5 \times 10^{-7}$ ohm·m. In addition, the foam can also be compressed to a thickness that is ninety-five percent or less of an uncompressed thickness and be resilient enough to recover to the uncompressed thickness.

Figure 6:
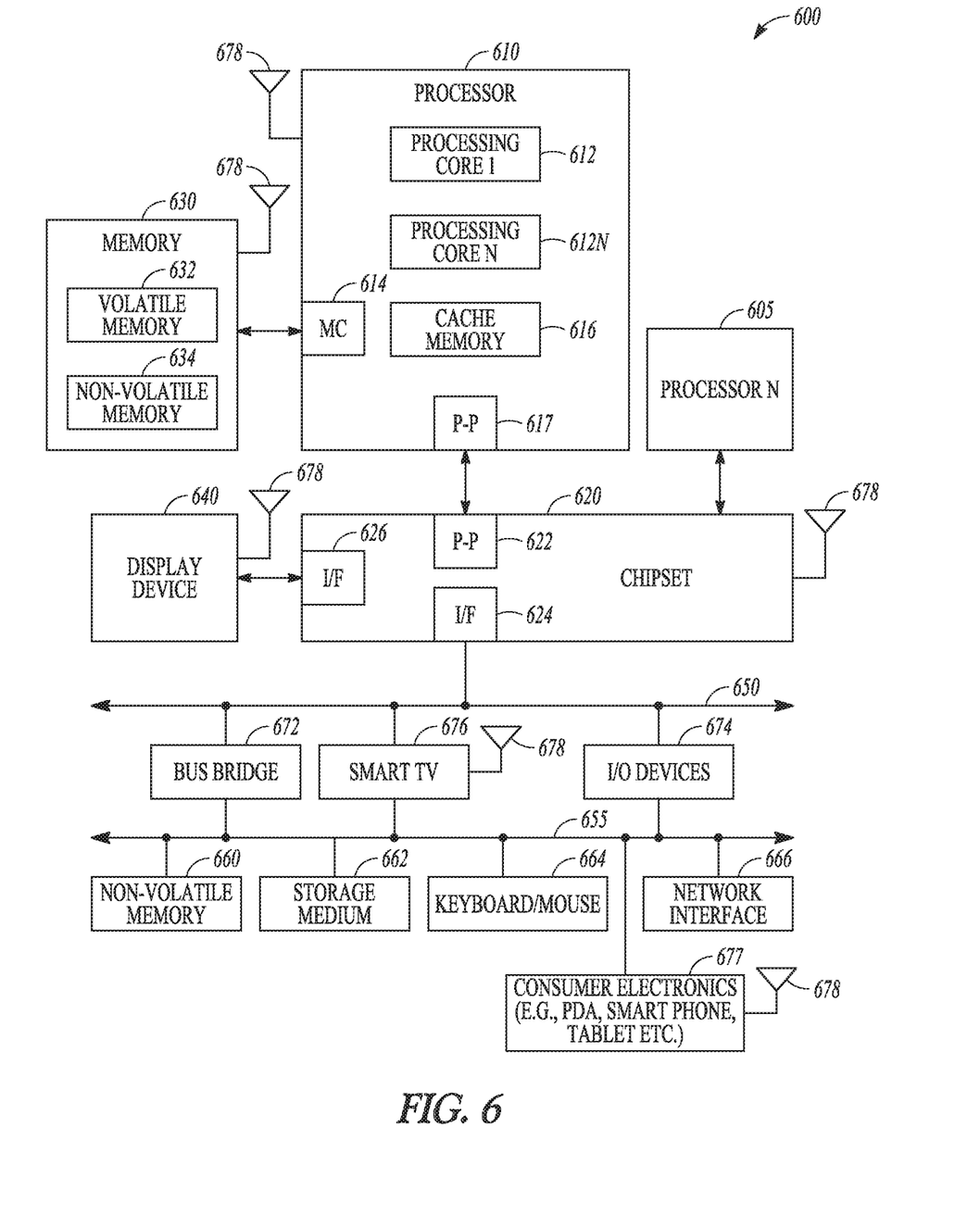
FIG. 6 is block diagram of an electronic system, according to an embodiment.

FIG. 6 illustrates a system level diagram, according to one embodiment of the invention. For instance, FIG. 6 depicts an example of an electronic device (e.g., system) including the foam 102, foam composite 200, foam composite 300, or electronic assembly 400 as described in the present disclosure. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Various Notes & Examples

To better illustrate the method and apparatuses disclosed herein, a non-limiting list of embodiments is provided here:

Example 1 includes a foam composite including a thermally conductive foam having pores disposed within the thermally conductive foam, wherein the thermally conductive foam can be compressible between an uncompressed thickness and a compressed thickness; and a filler disposed in the pores of the thermally conductive foam, wherein the filler includes a first thermal conductivity, the first thermal conductivity can be greater than a thermal conductivity of air.

Example 2 includes the foam composite of example 1, wherein the filler can be a liquid suspended in the pores and a size of the pores can be configured to retain the filler within the pores by surface tension.

Example 3 includes the foam composite of any one of examples 1-2, wherein the filler can be a phase change material that adapted to transition between phases within a temperature range of −40° C. to 125° C.

Example 4 includes the foam composite of any one of examples 1-3, further including a plurality of thermally conductive particles disposed within the filler, wherein the thermally conductive particles can include a second thermal conductivity greater than the first thermal conductivity of the filler.

Example 5 includes the foam composite of any one of examples 1-4, further including a plurality of thermally conductive particles disposed within the filler, wherein the thermally conductive particles can include a phase change material.

Example 6 includes the foam composite of any one of examples 1-5, wherein the plurality of thermally conductive particles can include SiC, Diamond, or ZnO, or the like.

Example 7 includes the foam composite of any one of examples 1-6, wherein the thermally conductive foam can be greater than fifty-percent copper.

Example 8 includes the foam composite of any one of examples 1-7, further including an interface sheet disposed along at least a first or second side of the thermally conductive foam, wherein the interface sheet can include a conductive material.

Example 9 includes an electronic assembly including an electronics package having a heat dissipation surface; a heat sink; and a thermally conductive foam compressed between the heat dissipation surface and the heat sink, wherein the thermally conductive foam includes: a plurality of pores disposed within the thermally conductive foam, and a continuous path of substantially homogeneous thermally conductive material disposed between a first side and a second side of the thermally conductive foam.

Example 10 include the electronic assembly of example 9, further including a filler disposed in the pores of the thermally conductive foam, wherein the filler can include a first thermal conductivity, the first thermal conductivity can be greater than a thermal conductivity of air.

Example 11 includes the electronic assembly of any one of examples 9-10, wherein the filler can be a liquid suspended in the pores and a size of the pores is can be configured to retain the filler within the pores by surface tension.

Example 12 includes the electronic assembly of any one of examples 9-11, wherein the filler can be a phase change material that adapted to transition between phases within a temperature range of −40° C. to 125° C.

Example 13 includes the electronic assembly of any one of examples 9-12, further including a plurality of thermally conductive particles disposed within the filler, wherein the thermally conductive particles can include a second thermal conductivity greater than the first thermal conductivity of the filler.

Example 14 includes the electronic assembly of any one of examples 9-13, further including a plurality of thermally conductive particles disposed within the filler, wherein the thermally conductive particles can include a phase change material.

Example 15 includes the electronic assembly of any one of examples 9-14, wherein the plurality of thermally conductive particles can include SiC, Diamond, ZnO, or the like.

Example 16 includes the electronic assembly of any one of examples 9-15, wherein the thermally conductive foam can be greater than fifty-percent copper.

Example 16 includes the electronic assembly of any one of examples 9-15, further including an interface sheet disposed along at least the first side or the second side of the thermally conductive foam, wherein the interface sheet can include a conductive material.

Example 18 includes a method including inserting a thermally conductive foam between an electronic package and a heat sink, a first side of the thermally conductive foam can be interfaced with a dissipation surface of the electronic package, and a second side of the thermally conductive foam can be interfaced with the heat sink, wherein the thermally conductive foam can include pores disposed within the thermally conductive foam; and the method further includes compressing the thermally conductive foam between the electronic package and the heatsink by at least five percent of a thickness of the thermally conductive foam.

Example 19 includes the method of example 18, further including attaching an interface sheet to at least one side of the foam composite.

Example 20 includes the method of any one of examples 18-19, further including filling a plurality of pores with a filler, the plurality of pores can be disposed within a thermally conductive foam, wherein the filler can include a first thermal conductivity greater than a thermal conductivity of air, and the thermally conductive foam can be compressible between an uncompressed thickness and a compressed thickness, the compressed thickness can be ninety-five percent or less of the uncompressed thickness.

Example 21 include the method of any one of examples 18-20, wherein filling a plurality of pores with a filler can include packing the filler into the pores under pressure.

Example 22 includes the method of any one of examples 18-21, further including dispersing a plurality of thermally conductive particles within the filler, wherein the plurality of thermally conductive particles can have a second thermal conductivity greater than the first thermal conductivity of the filler.

Example 23 includes the method of any one of examples 18-22, wherein filling a plurality of pores with a filler can include filling the plurality of pores with a filler that can be a liquid suspended in the pores, and a size of the pores can be configured to retain the filler within the pores by surface tension.

Example 24 includes the method of any one of examples 18-23, wherein filling a plurality of pores with a filler can include filling the plurality of pores with a phase change material that can be adapted to transition between phases within an operational temperature range of an electronics package.

Example 25 includes a foam composite including a foam having pores disposed within the foam, wherein the foam can be compressible between an uncompressed thickness and a compressed thickness; and a filler can be disposed in the pores of the foam, wherein the filler can include a first thermal conductivity, the first thermal conductivity can be between 10 W/m·K and 400 W/m·K.

Example 26 includes the foam composite of example 25, wherein the foam can be a conductive foam.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A foam composite comprising: a thermally conductive foam including pores disposed within the thermally conductive foam, wherein the thermally conductive foam is greater than fifty-percent copper and compressible between an uncompressed thickness and a compressed thickness; and a filler with a liquid phase disposed in the pores of the thermally conductive foam, wherein the filler includes a first thermal conductivity, the first thermal conductivity is greater than a thermal conductivity of air; and a plurality of thermally conductive particles disposed within the filler, wherein the thermally conductive particles have a second thermal conductivity greater than the first thermal conductivity of the filler; and the filler is a phase change material that adapted to transition between phases within a temperature range of −40° C. to 125° C.

2. The foam composite of claim 1, wherein the plurality of thermally conductive particles include SiC, Diamond, or ZnO.

3. An electronic assembly comprising: an electronics package including a heat dissipation surface; a heat sink; and a thermally conductive foam compressed between the heat dissipation surface and the heat sink, wherein the thermally conductive foam includes: a plurality of pores disposed within the thermally conductive foam, wherein the thermally conductive foam is greater than fifty-percent copper and compressible between an uncompressed thickness and a compressed thickness, a filler disposed in the pores of the thermally conductive foam, wherein the filler includes a first thermal conductivity, the first thermal conductivity is greater than a thermal conductivity of air; and a plurality of thermally conductive particles disposed within the filler, wherein the thermally conductive particles have a second thermal conductivity greater than the first thermal conductivity of the filler; and the filler is a phase change material that adapted to transition between phases within a temperature range of −40° C. to 125° C.; a continuous path of substantially homogeneous thermally conductive material disposed between a first side and a second side of the thermally conductive foam.

4. The electronic assembly of claim 3, wherein the plurality of thermally conductive particles include SiC, Diamond, or ZnO.

5. The electronic assembly of claim 3, further comprising an interface sheet disposed along at least the first side or the second side of the thermally conductive foam, wherein the interface sheet includes a conductive material.

6. A method comprising: inserting a thermally conductive foam between an electronic package and a heat sink; wherein the thermally conductive foam is greater than fifty-percent copper and compressible between an uncompressed thickness and a compressed thickness, a first side of the thermally conductive foam interfaced with a dissipation surface of the electronic package, and a second side of the thermally conductive foam interfaced with the heat sink, wherein the thermally conductive foam includes pores disposed within the thermally conductive foam; and compressing the thermally conductive foam between the electronic package and the heatsink by at least five percent of a thickness of the thermally conductive foam; filling a plurality of pores with a filler, the plurality of pores disposed within a thermally conductive foam, wherein the filler includes a first thermal conductivity greater than a thermal conductivity of air; and a plurality of thermally conductive particles disposed within the filler, wherein the thermally conductive particles have a second thermal conductivity greater than the first thermal conductivity of the filler; and the filler is a phase change material that adapted to transition between phases within a temperature range of −40° C. to 125° C., and the thermally conductive foam is compressible between an uncompressed thickness and a compressed thickness, the compressed thickness being ninety-five percent or less of the uncompressed thickness.

7. The method of claim 6, further comprising attaching an interface sheet to at least one side of the foam composite.

* * * * *